US007345881B2

(12) United States Patent
Colbert et al.

(10) Patent No.: US 7,345,881 B2
(45) Date of Patent: Mar. 18, 2008

(54) NON-INFLUENCING FASTENER FOR MOUNTING A HEAT SINK IN CONTACT WITH AN ELECTRONIC COMPONENT

(75) Inventors: John Lee Colbert, Byron, MN (US); John Saunders Corbin, Jr., Austin, TX (US); Eric Alan Eckberg, Rochester, MN (US); James Dorance Gerken, Zumbro Falls, MN (US); Roger Duane Hamilton, Rochester, MN (US); Maurice Francis Holahan, Lake City, MN (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 11/379,417

(22) Filed: Apr. 20, 2006

(65) Prior Publication Data

US 2007/0247813 A1 Oct. 25, 2007

(51) Int. Cl.
*H05K 7/20* (2006.01)

(52) U.S. Cl. .................. 361/707; 24/457; 24/458; 248/505; 248/510; 257/719; 165/80.3; 165/185; 361/710; 361/719

(58) Field of Classification Search .................. 257/719
See application file for complete search history.

(56) References Cited

U.S. PATENT DOCUMENTS

| 4,797,762 | A | 1/1989 | Levy et al. |
| 4,945,435 | A | 7/1990 | Boigenzahn et al. |
| 5,754,372 | A | 5/1998 | Ramsdell et al. |
| 5,864,441 | A | 1/1999 | Coffey et al. |
| 6,205,004 | B1 | 3/2001 | Kim |
| 6,404,634 | B1 * | 6/2002 | Mann .......................... 361/704 |
| 6,545,879 | B1 * | 4/2003 | Goodwin ..................... 361/807 |
| 6,549,410 | B1 * | 4/2003 | Cohen ......................... 361/704 |
| 6,611,431 | B1 * | 8/2003 | Lee et al. .................... 361/719 |
| 6,826,054 | B2 * | 11/2004 | Liu .............................. 361/719 |
| 6,859,367 | B2 * | 2/2005 | Davison ...................... 361/704 |
| 6,924,962 | B2 | 8/2005 | Jeong |
| 7,262,969 | B2 * | 8/2007 | Lee et al. .................... 361/704 |
| 2007/0035937 | A1 * | 2/2007 | Colbert et al. .............. 361/810 |

* cited by examiner

*Primary Examiner*—Gregory D Thompson
(74) *Attorney, Agent, or Firm*—Rabin & Berdo, P.C.

(57) ABSTRACT

A load frame has an open region exposing a surface of an electronic component. A heat sink is disposed on the load frame and has a surface in thermal contact with the surface of the electronic component. A non-influencing fastener is disposed within a bore in the heat sink and threaded into the load frame for securing the heat sink to the load frame. The non-influencing fastener includes a screw with a head; a tapered ring disposed below the head of the screw and having a tapered lower peripheral surface; a sealing ring engaging the tapered lower peripheral surface of the tapered ring; and a load washer disposed between the sealing ring and the load frame. Compression of the rings by turning of the screw into the load frame causes the sealing ring to expand against the bore of the heatsink. Preferably, the sealing ring has a curved outer surface.

18 Claims, 6 Drawing Sheets

NON-INFLUENCING FASTENER FOR MOUNTING A HEAT SINK IN CONTACT WITH AN ELECTRONIC COMPONENT

BACKGROUND OF THE INVENTION

1. Field of the Invention

The invention relates to a non-influencing fastener, and specifically to a non-influencing fastener for mounting a heat sink in contact with an electronic component.

2. Background Information

Electronic components, such as microprocessors and integrated circuits, must operate within certain specified temperature ranges to perform properly. Excessive heat degrades electronic component performance, reliability, life expectancy, and can even cause failure. Heat sinks are widely used for dissipating excessive heat. Typically, heat sinks are formed with fins, pins or other similar structures to increase the surface area of the heat sink and thereby enhance heat dissipation as air passes over the heat sink. Where large amounts of heat are to be dissipated, heat sinks may contain high performance structures, such as vapor chambers and/or heat pipes, to further enhance heat transfer. Heat sinks are typically formed of metals, such as copper or aluminum. More recently, graphite-based materials have been used for heat sinks because such materials offer several advantages, such as improved thermal conductivity and reduced weight.

Electronic components are generally packaged using electronic packages (i.e., modules) that include a module substrate to which the electronic component is electronically connected. In some cases, the module includes a cap (i.e., a capped module) which seals the electronic component within the module. In other cases, the module does not include a cap (i.e., a bare die module). Bare die modules typically exhibit better thermal performance than capped modules because bare die modules eliminate two sources of thermal resistance present in capped modules, i.e., the thermal resistance of the cap and the thermal resistance of the thermal interface between the cap and the electronic component. For small heatsinks, the thermal interface material can be an adhesive and the bare die module is capable of carrying the mass of the heatsink during any shock or vibration event. However, as component power dissipation increases, the volume and mass of the heatsink increase accordingly, and the bare die can no longer support the mass of the heatsink alone.

Larger heat sinks can be attached to modules using a variety of attachment mechanisms, such as clamps, screws, and other hardware. The attachment mechanism typically applies a force that maintains a thermal interface gap, i.e., the thickness of the thermal interface between the heat sink and the module. If a capped module is used in such applications, the cap protects the electronic component from physical damage from the applied force. However, as noted, bare die modules have better thermal transfer performance than capped modules. If a bare die module is used, the applied force is transferred directly through the electronic component itself. Consequently, when bare die modules are used, care must be taken to apply only a controlled amount of force and the attachment mechanism for the heat sink requires a non-influencing fastener, i.e., one that locks in the position of the heat sink without influencing the force applied to the thermal interface gap.

SUMMARY OF THE INVENTION

It is, therefore, a principle object of this invention to provide a non-influencing fastener for mounting a heat sink in contact with an electronic component.

It is another object of the invention to provide a non-influencing fastener for mounting a heat sink that solves the above mentioned problems.

These and other objects of the present invention are accomplished by the non-influencing fastener for mounting a heat sink in contact with an electronic component that is disclosed herein.

In a first aspect of the invention, a non-influencing fastener is disposed within a bore in a heat sink and threaded into a load frame for securing the heat sink to the load frame. The non-influencing fastener is comprised of a screw with a head; a tapered ring disposed on the screw below the head of the screw and having a tapered lower peripheral surface; and a sealing ring disposed on the screw and engaging the tapered lower peripheral surface of the tapered ring. Compression of the rings by turning of the screw into the load frame causes the sealing ring to expand against the bore of the heatsink. Preferably, the non-influencing fastener also includes a load washer disposed on the screw between the sealing ring and the load frame. The sealing ring preferably has a curved outer surface. In a preferred embodiment, the sealing ring is a split metal ring with a tapered inner surface. Alternatively, the sealing ring could be a split ring with a circular cross-section and could be formed from a hard metal wire.

In another aspect of the invention, a method for securing a heat sink to a load frame includes the following steps: providing a screw having a head; providing on the screw below the head a tapered ring having a tapered lower peripheral surface; providing on the screw a sealing ring engaging the tapered lower peripheral surface of the tapered ring; inserting the screw with the rings into a bore in the heatsink; and compressing the rings by threading the screw into the load frame so as to cause the sealing ring to expand against the bore of the heatsink. A further preferable step in the method is providing a load washer on the screw between the sealing ring and the load frame.

In a further aspect of the invention, a heat transfer apparatus comprises a load frame having an open region exposing a surface of an electronic component; a heat sink disposed on the load frame and having a surface in thermal contact with the surface of the electronic component through a thermally conductive material, the load frame applying a preload force to the heat sink to compress the thermally conductive material and achieve a desired thermal interface gap between the surface of the heat sink and the surface of the electronic component; and at least one non-influencing fastener disposed within a bore of the heat sink and threaded into the load frame to secure the heat sink to the load frame and maintain the desired thermal interface. Each of the non-influencing fasteners includes a screw with a head; a tapered ring disposed on the screw below the head of the screw and having a tapered lower peripheral surface; and a sealing ring disposed on the screw and engaging the tapered lower peripheral surface of the tapered ring, such that compression of the rings by turning of the screw into the load frame causes the sealing ring to expand against the bore of the heatsink. Placing the tapered ring above the sealing ring on the screw advantageously stabilizes the expanding sealing ring on the load frame, thereby isolating any axial motion with respect to the heat sink. Having an external radius on the sealing ring allows a good contact interface with the heat sink bore even if axial misalignment is introduced between the fastener and the heat sink.

DETAILED DESCRIPTION OF THE PREFERRED EMBODIMENTS

The invention will now be described in more detail by way of example with reference to the embodiments shown in the accompanying figures, where like designations denote like elements. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

Figure 1:
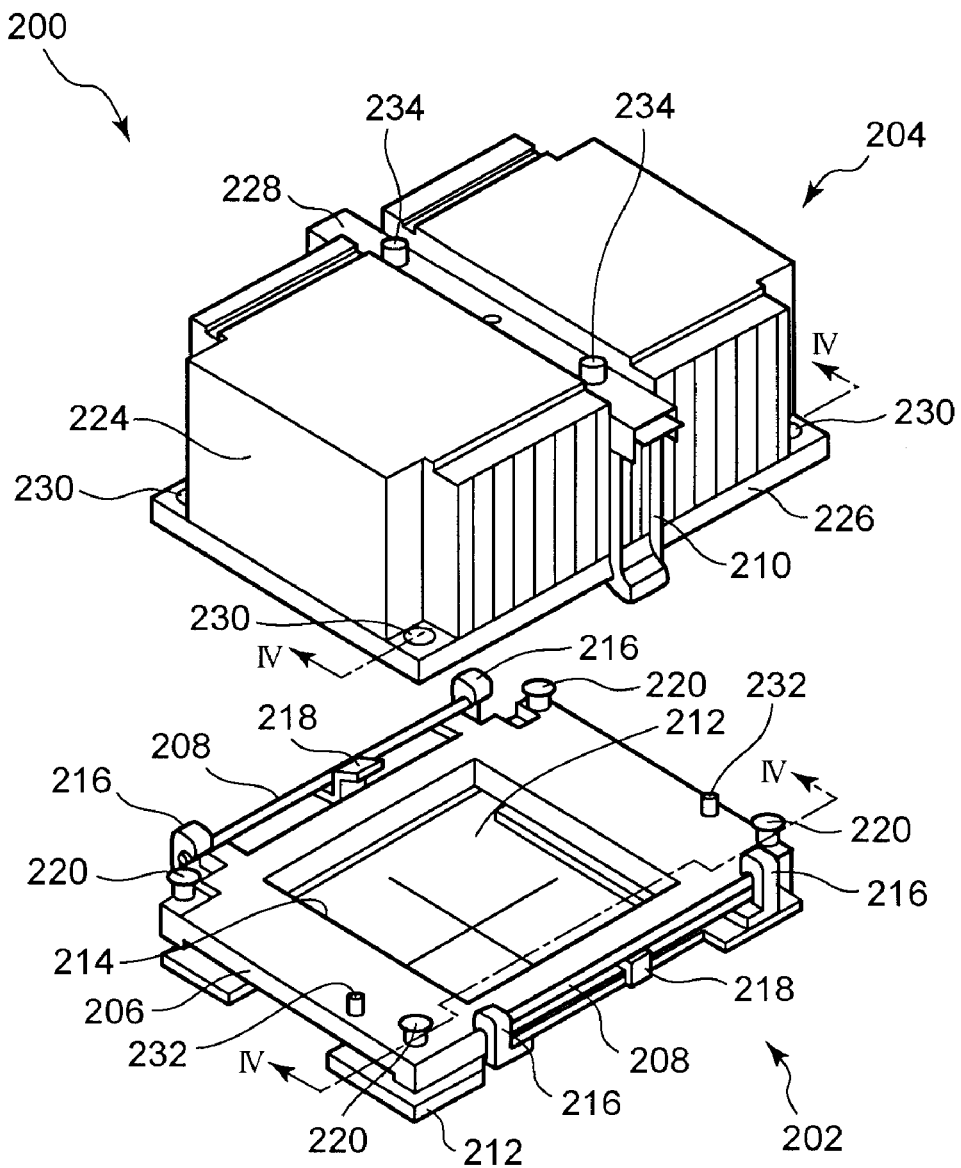
FIG. 1 is an exploded perspective view of a heat transfer apparatus incorporating the present invention.
Figure 2:
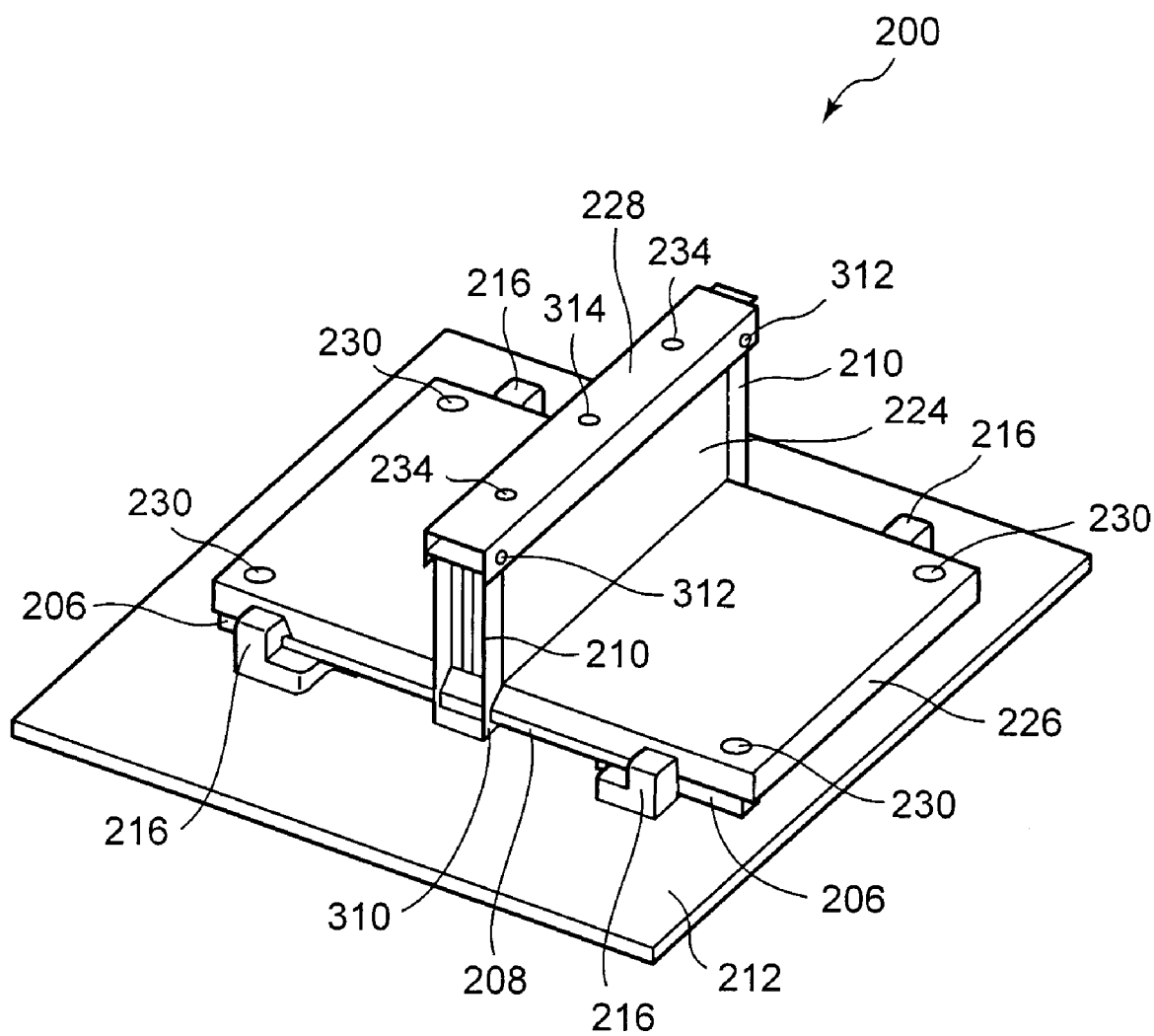
FIG. 2 is a perspective view of the heat transfer apparatus shown in FIG. 1 with portions of the heat sink removed.
Figure 3:
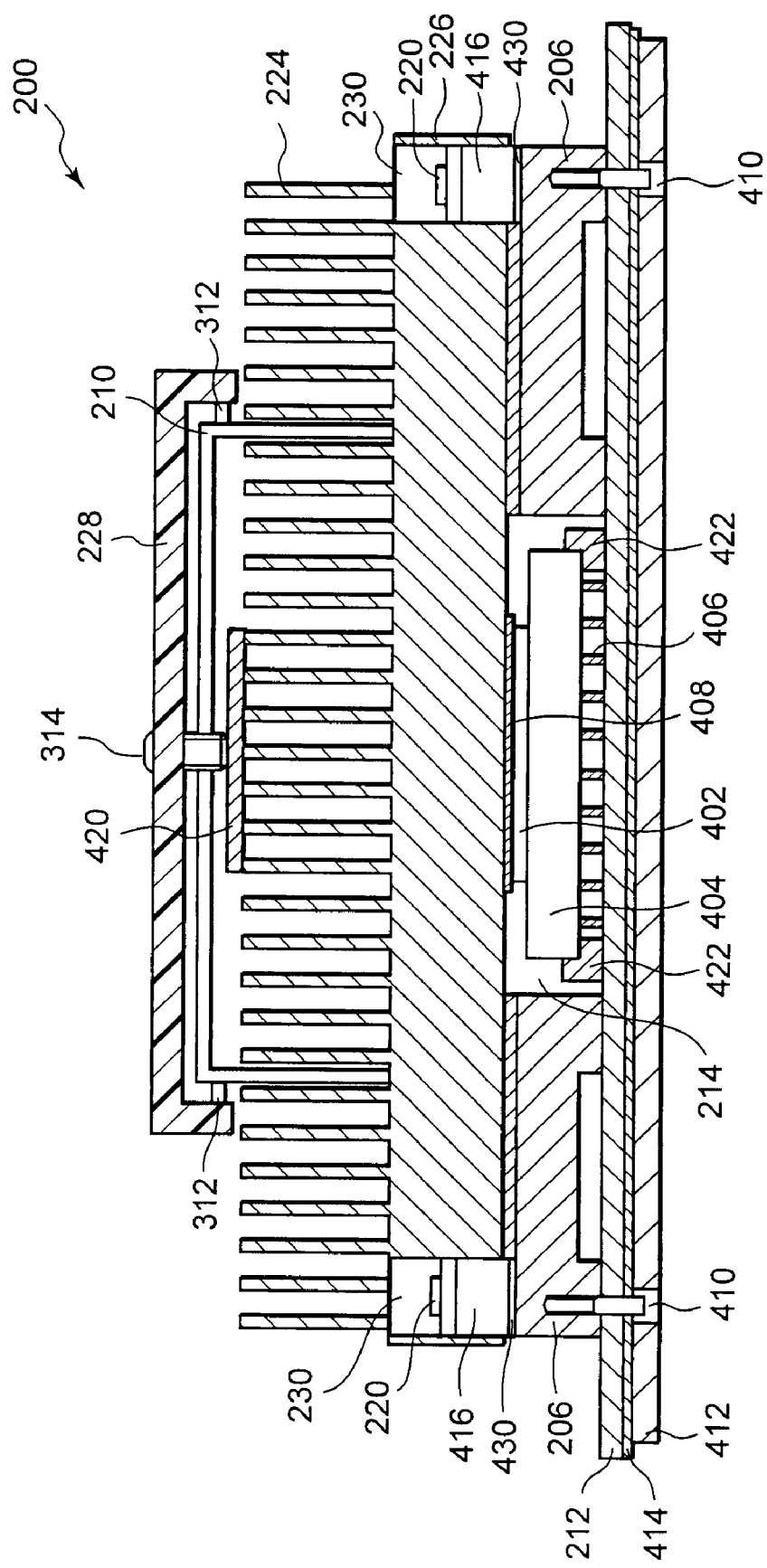
FIG. 3 is a cross-sectional view of the heat transfer apparatus shown in FIG. 1.

Reference is now made to FIGS. 1-3 for illustrating an exemplary heat transfer apparatus 200 incorporating a preferred embodiment of the inventive non-influencing fastener for mounting a heat sink on a heat source, such as an electronic component. FIGS. 1-3 are intended to depict the representative major components of heat transfer apparatus 200 at a high level, it being understood that individual components may have lesser or greater complexity than represented in FIG. 1-3, and that the number, type and configuration of such components may vary.

As best seen in FIG. 1, which is an exploded perspective view of heat transfer apparatus 200, heat transfer apparatus 200 comprises two main components, i.e., a load frame/spring assembly 202 and a heat sink/load arm assembly 204. Load frame/spring assembly 202 includes a load frame 206 and a pair of load springs 208. Load springs 208 are preferably made of an alloy material chosen for its high tensile strength properties, such as high strength music wire. Although two load springs 208 are shown in FIG. 1, those skilled in the art will appreciate that the load frame/spring assembly 202 may include any number of load springs 208 (as well as load arms 210, which engage the load springs 208 as described below in the discussion of the heat sink/load arm assembly 204).

Load frame 206 is mounted on a printed circuit board 212. Referring now temporarily to FIG. 3, fasteners such as screws 410 (two of which are denoted in FIG. 3) are used to attach load frame 206 to printed circuit board 212. Preferably, four screws 410 (i.e., one near each corner of load frame 206) pass through thru-holes in a backside stiffener 412, an insulator 414 such as a polyimide, and printed circuit board 212, and are received in threaded holes in load frame 206.

Now returning to FIG. 1, load frame 206 includes one or more open regions 214 in which is disposed the heat source, e.g., an electronic component (not shown in FIG. 1) mounted on printed circuit board 212. For example, a bare die module may be mounted on printed circuit board 212 at the location designated at the intersection of the cross-hairs is shown in FIG. 1.

As shown in FIG. 1, load frame 206 includes four mounting projections 216 to which the ends of load springs 208 are secured. Load frame 206 also includes two down-stop support projections 218 on which rest the mid-sections of load springs 208.

One or more non-influencing fasteners 220 are used to secure heat sink/load arm assembly 204 to load frame/spring assembly 202. Preferably, four non-influencing fasteners 220 are mounted on load frame 206. Each of the non-influencing fasteners 220 is preferably threaded into a boss 416 (shown in FIG. 3) of load frame 206. The non-influencing fasteners lock the heat sink in position without influencing the position of the heat sink.

Heat sink/load arm assembly 204 includes a heat sink 224 having a base plate 226. Preferably, heat sink 224 is formed with fins, pins or other similar structures to increase the surface area of the heat sink and thereby enhance heat dissipation as air passes over the heat sink. Heat sink 224 may also contain high performance structures, such as vapor chambers and/or heat pipes (not shown), to further enhance heat transfer. Heat sink 224 may, for example, be formed of metals, such as copper or aluminum, or other materials, such as graphite-based materials.

As mentioned above, heat sink/load arm assembly 204 includes load arms 210. Load arms 210 are pivotally attached to a U-channel load plate 228. When heat sink/load arm assembly 204 is attached to load frame/spring assembly 202, load arms 210 engage the load springs 208. This engagement is described in detail below with reference to FIGS. 2 and 3. In addition, when heat sink/load arm assembly 204 is attached to load frame/spring assembly 202, non-influencing fasteners 220 are received in bore holes 230 in the heat sink's base plate 226. This non-influencing fastener arrangement is described in detail below with reference to FIGS. 3-5. To aid in alignment of heat sink/load arm assembly 204 with respect to load frame/spring assembly 202, load frame 206 may include alignment pins 232 that are received in corresponding alignment holes (not shown) in the heat sink's base plate 226.

FIG. 2 is a perspective view of heat transfer apparatus 200 with portions of heat sink 224 removed. FIG. 3 is a cross-sectional view of heat transfer apparatus 200. As best seen with reference to FIGS. 2 and 3, an actuation mechanism applies a preload force to heat sink 224 toward a semiconductor chip 402 (shown in FIG. 3) to compress a thermally conductive material 408 (shown in FIG. 3) and achieve a desired thermal interface gap between heat sink 224 and semiconductor chip 402. The main components of the actuation mechanism include load frame 206, the load frame's mounting projections 216, load springs 208, load arms 210, the load arms' hook portions 310, hinge pins 312, U-channel load plate 228, actuation screw 314, push plate 420, the push plate's guide pins 234, heat sink 224, and the heat sink's base plate 226. Referring to FIG. 2 for the moment, load arms 210 each include a hook portion 310 that engages one of the load springs 208. Load arms 210 are pivotally attached to U-channel load plate 228 by hinge pins 312. An actuation screw 314 is threaded through U-channel load plate 228 to engage an underlying push plate 420 (shown in FIG. 3). Actuation screw 314 is accessible for actuation from the top of U-channel load plate 228. The distance between the U-channel plate and push plate 420 is adjusted by turning actuation screw 314. This provides a controlled rate of loading. Those skilled in the art will recognize that other actuation elements and techniques to provide a controlled rate of loading are possible, such as camming, rocking and the like.

Still referring to FIG. 2, when the load frame/spring assembly and the heat sink/load arm assembly are brought together, hook portions 310 of load arms 210 are engaged with load springs 208, and the actuation mechanism is actuated by turning actuation screw 314 in a direction to increase the distance between U-channel load plate 228 and the underlying push plate 420 (shown in FIG. 3). Load springs 208 are deflected by actuation of the actuation mechanism. The geometric parameters of load springs 208, i.e., the span, cross-section profile, and diameter) are optimized for the allowable space within the application and the required resulting load. Force is transmitted through the heat sink's fins and base plate 226 onto the underlying semiconductor chip 402 (shown in FIG. 3). The force compresses a thermally conductive material 408 (shown in FIG. 3) and achieves a desired thermal interface gap between heat sink's base plate 226 and semiconductor chip 402.

Referring now to FIG. 3, push plate 420 is affixed to heat sink 224. Preferably, push plate 420 is affixed in a location directly above the heat source, with the width of U-channel load plate 228 and push plate 420 substantially capturing the footprint of the heat source. This provides centroid loading above the bare die module, and thus provides substantially no edge stresses on the die. As shown in FIG. 3, for example, push plate 420 is affixed to seven of the heat sink's fins that lie above semiconductor chip 402. Although not shown in FIG. 3, additional modules residing on printed circuit board 212 may be accommodated in open area 214 of load frame 206. In such a case, push plate 420 is preferably affixed in a location directly over the primary module, with the width of U-channel load plate 228 and push plate 420 substantially capturing the footprint of the primary module.

As best seen in FIGS. 1 and 2, push plate preferably includes guide pins 234 that extend through corresponding holes in U-channel load plate 228. The purpose of guide pins 234 is to align push plate 420 relative to U-channel load plate 228.

As shown in FIG. 3, the heat source is one or more bare die modules, each bare die module comprising an electronic component such as a semiconductor chip 402, a module substrate 404, and an electronic connector 406. However, those skilled in the art will appreciate that the heat transfer apparatus 200 may accommodate other types of heat sources such as one or more capped modules and/or other electronic components. The bare die module shown in FIG. 3 is a single-chip module (SCM); however, those skilled in the art will recognize that the spirit and scope of the present invention is not limited to SCMs. For example, those skilled in the art will recognize that the heat transfer apparatus 200 may accommodate one or more multi-chip modules (MCMs), or a combination of MCMs, SCMs and/or other electronic components/heat sources.

As shown in FIG. 3, semiconductor chip 402 is electrically connected to module substrate 404. Electronic connector 406, which electrically connects printed circuit board 212 to module substrate 404, may be a pin grid array (PGA), a ceramic column grid array (CCGA), a land grid array (LGA), or the like.

In some cases, electronic connector 406 may be susceptible to being crushed by the force applied by the actuation mechanism. This is problematic not only from the perspective of possible damage to electronic connector 406, but also throws off the planarity of the stack (i.e., the module substrate 404 and semiconductor chip 402) relative to the heat sink's base plate which causes thermally conductive material 408 to form an uneven thermal interface gap. In such cases, one or more crush protection elements 422 (denoted with a dotted line in FIG. 3 due to the optional nature thereof) may be inserted along peripheral portions of module substrate 404 between the bottom of module substrate 404 and the top of printed circuit board 212. The crush protection elements 422 may be made of a material such as a polythermal plastic or the like.

Referring back to FIG. 3, thermal interface 408 is made of a thermally conductive material such as thermal gel, grease, paste, oil, or other high thermal conductivity material. Typically, thermal interface 408 is relatively thin so that it may easily transfer heat away from semiconductor chip 402 and toward the heat sink's base plate 226. The thickness of thermal interface 408 extending between the bottom of the heat sink's base plate 226 and the top surface of semiconductor chip 402 is referred to as the thermal interface gap. Preferably, the thermal interface gap is about 1.2 mils.

Thermally conductive material 408 is dispensed on semiconductor chip 402 prior to bringing the load frame/spring assembly and the heat sink/load arm assembly together. To protect semiconductor 402 as these assemblies are initially brought together, a viscoelastic foam pad 430 may be interposed between the lower surface of the heat sink's base plate 226 and the upper surface of load frame 206.

Those skilled in the art will appreciate that the actuation mechanism shown in FIGS. 2 and 3 is exemplary, and that other actuation mechanisms may be used to apply the preload force within the spirit and scope of the present invention. According to the present invention, once the preload force is applied to achieve the desired thermal gap, irrespective of the actuation mechanism that applied the preload force, one or more non-influencing fasteners 220 are actuated to secure the heat sink to the load frame and maintain the desired thermal gap.

As shown in FIG. 3, when the heat sink/load arm assembly is attached to the load frame/spring assembly, non-influencing fasteners 220 are received in bore holes 230 in the heat sink's base plate 226. Once the actuation mechanism applies the preload force to achieve the desired thermal interface gap, non-influencing fasteners 220 are actuated to secure heat sink 224 to load frame 206 and maintain the desired thermal gap.

Figure 4:
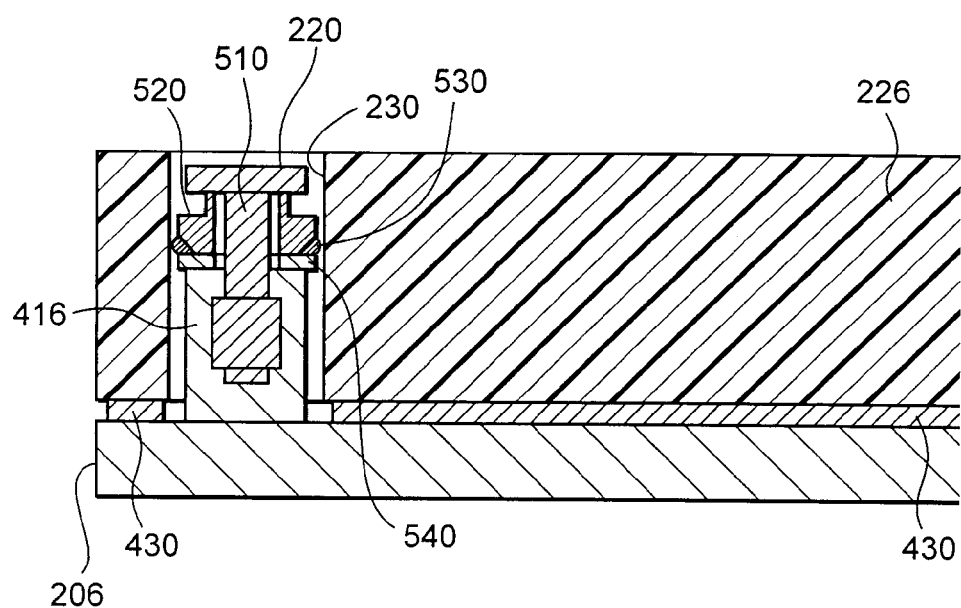
FIG. 4 is a cross-sectional view of a portion of the heat transfer apparatus shown in FIG. 2 showing a non-influencing fastener arrangement with a non-influencing fastener according to the present invention, in an actuated state.
Figure 5:
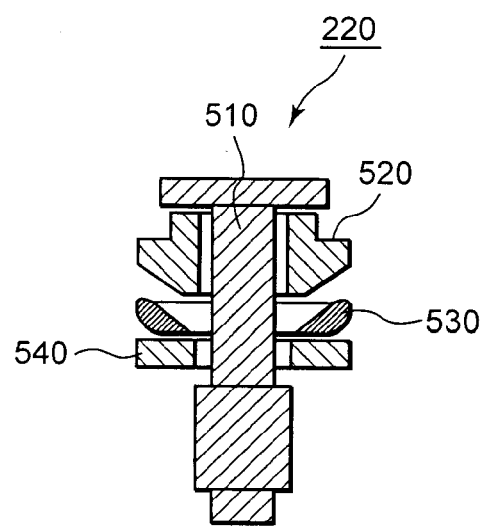
FIG. 5 is a cross-sectional view of the non-influencing fastener shown in FIG. 4, in a non-actuated state.

The non-influencing fastener arrangement according to the present invention is shown in more detail in FIGS. 4 and 5. FIG. 4 shows the non-influencing fastener arrangement with non-influencing fastener 220 in an actuated state. FIG. 5 shows non-influencing fastener 220 in a non-actuated state. Non-influencing fastener 220 includes a screw 510 that is threaded into one of the bosses 416 of load frame 206. Captivated on screw 510 are a tapered ring 520, directly below the head of the screw 510, and a sealing ring 530 under the tapered portion of tapered ring 520. Preferably, non-influencing fastener 220 also includes a load washer 540 interposed between the sealing ring 530 and the load frame's boss 416.

The non-influencing fastener 220 is smaller in diameter than the bore hole 230 in the heat sink's base plate 226. It is inserted into the bore hole 230 and actuated by turning screw 510 into the load frame's boss 416 so that sealing ring 530 is expanded against the wall of bore hole 230 in the heat sink's base plate 226 to hold the heat sink in place. The inventive non-influencing fasteners 220 are advantageous because unlike conventional fasteners, they can be actuated without having a downward component of motion and force that would affect the thermal interface gap established by the preload force of the heat transfer apparatus' actuation mechanism.

As shown in FIG. 5, the sealing ring 530 preferably has a curved outer surface. The curved outer surface allows for good contact between the non-influencing fastener 220 and the heatsink bore 230, even when there is some axial tilt tolerance between the non-influencing fastener 220 and the heatsink bore 230. In a preferred embodiment, the sealing ring 530 is a split metal ring with a tapered inner surface. Alternatively, the sealing ring could be a split ring with a circular cross-section and could be formed from a hard metal wire. Advantageously, the split metal ring easily expands radially when actuated by the tapered ring 520, to provide a stable connection between the heat sink 224 and the load frame 206. In an alternative embodiment, the sealing ring 530 may be made of a low yield strength metal or an elastomer. One skilled in the art will appreciate that the optimum hardness for the sealing ring will depend on its geometry.

Figure 6:
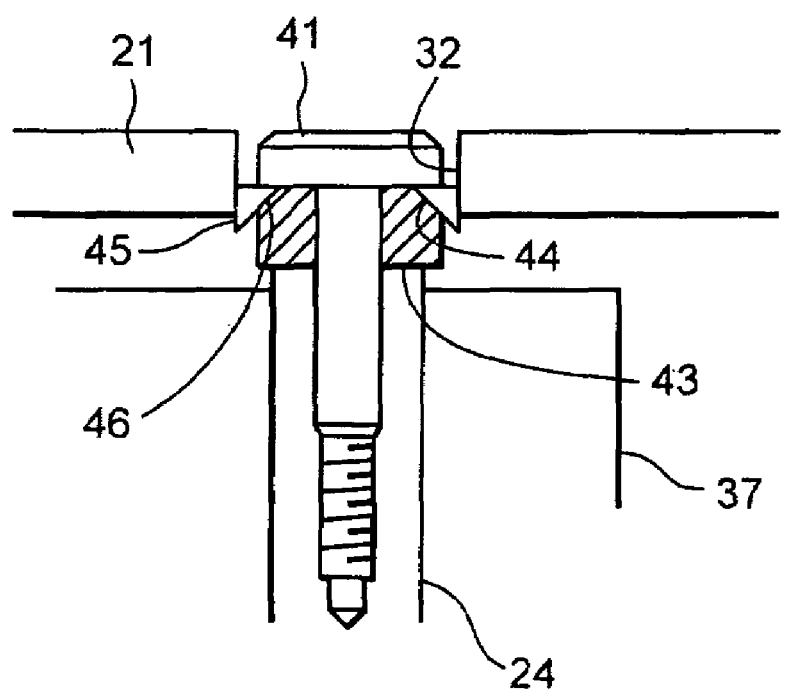
FIG. 6 is a cross-sectional view of a prior art non-influencing fastener shown in an actuated state.

FIG. 6 illustrates a prior art non-influencing fastener disclosed in U.S. Pat. No. 4,945,435 (the '435 patent), issued on Jul. 1, 1990 and assigned to the International Business Machines Corporation. The '435 patent is directed to a fastening structure for a disk drive that is used to secure a shaft for the drive's pickup arm between parallel walls of a box shaped casting so as to secure and locate the shaft without inducing a distortion of the casting walls. As shown in FIG. 6, taken for FIG. 3 of the '435 patent, shaft 24 is attached to the bottom wall of a base casting (not shown) to support pick up arm assembly 37. The non-influencing fastener includes screw 41, which is threaded into the top of shaft 24, a tapered ring 43 with a tapered upper peripheral surface 44, which is placed on top of shaft 24, and a sealing ring 45, made of a low yield strength metal or an elastomer, with a mating tapered surface 46, which is placed between tapered ring 43 and screw 41. To actuate the fastener, screw 41 is threaded into the top of the shaft 24 to compress the washer 45 over the tapered surface 44 of tapered ring 43, causing the sealing ring to expand against the surface 32 defining the opening in the upper wall 21 of the base casting. This secures the top of shaft 24 and effectively seals the opening through which the fastener was installed.

The design of the prior art non-influencing fastener in the '435 patent is good in locking in a radial load, but does generate a small axial component of force when actuated that could influence the thermal interface gap in the present application. The design of the present non-influencing fastener essentially inverts the order of the tapered ring and the sealing ring from that disclosed in the prior art. This causes the sealing ring in the present non-influencing fastener to expand radially as the fastener is actuated, without any downward axial component of motion and force. The advantageous features of the present non-influencing fastener design, versus the prior art, are: (1) inverting the tapered ring and the sealing ring to stabilize the expanding sealing ring on the fixed pedestal, thereby isolating any axial motion with respect to the heat sink or other component that is being anchored; and (2) having an external radius on the sealing ring to allow a good contact interface even as axial misalignment is introduced between the fastener and the component being fastened.

Figure 7:
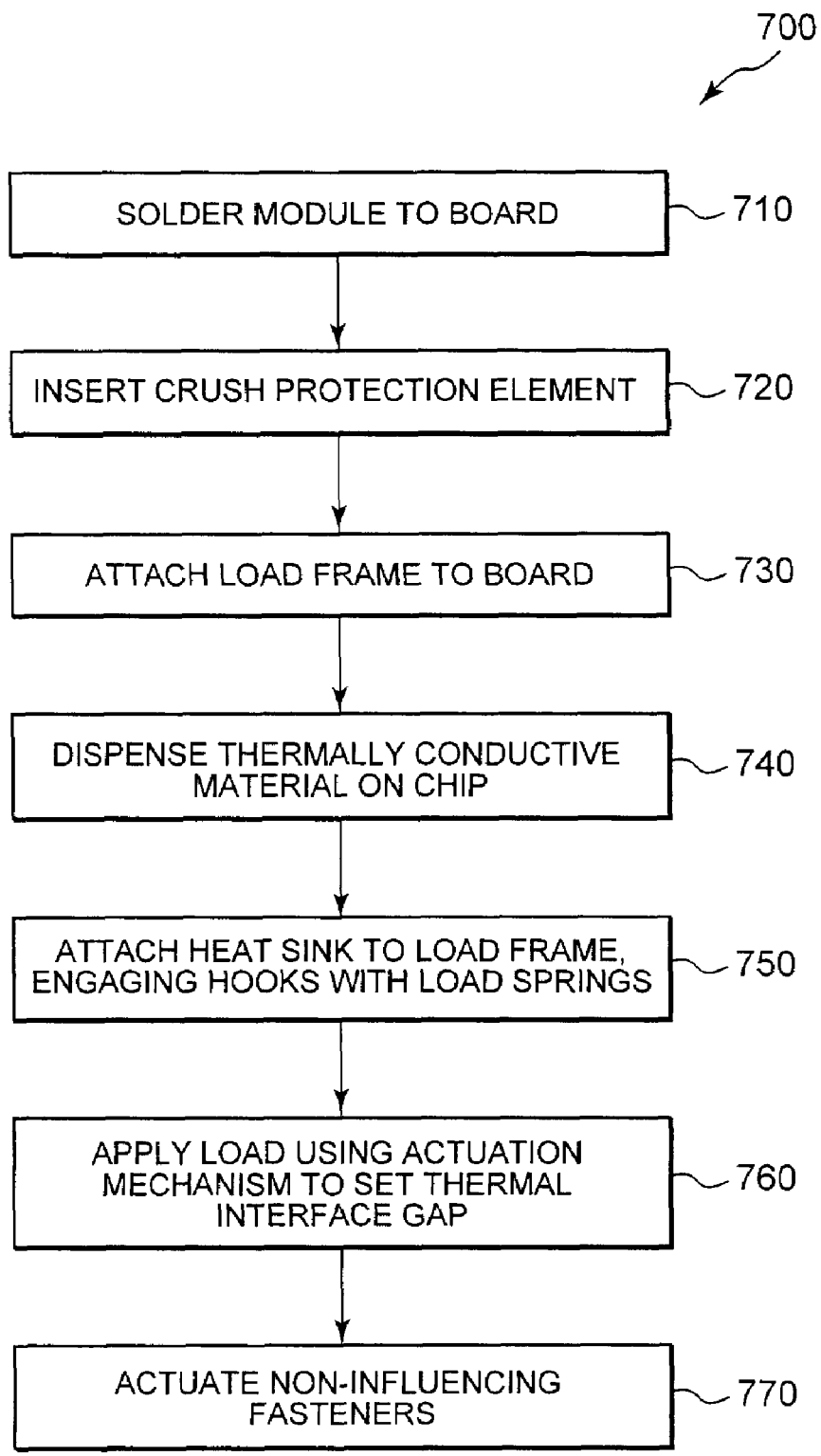
FIG. 7 is a flow diagram of a method for mounting a heat sink in thermal contact with an electronic component according to the present invention.

FIG. 7 is a flow diagram of a method 700 for mounting a heat sink in thermal contact with an electronic component using the non-influencing fasteners of the present invention. Method 700 sets forth the preferred order of the steps. It must be understood, however, that the various steps may occur in a different order relative to one another to accomplish the same result. The bare die module is soldered to the printed circuit board (step 710). If a crush protection element is desired, the crush protection element is inserted along peripheral portions of the module substrate between the bottom of module substrate and the top of printed circuit board (step 720). The load frame is attached to the printed circuit board (step 730). Thermally conductive material is dispensed on the semiconductor chip (step 740). Next, the heat sink/load arm assembly is aligned and brought into contact with the load frame/spring assembly (step 750). During step 750, the hook portion of each load arms is brought into engagement with one of the load springs. Method 700 continues with the application of a preload force using the actuation mechanism to set the thermal interface gap (step 760). During step 760, the actuation screw is turned an appropriate amount to apply a preload force (e.g., 40 lbs) that provides the desired thermal interface gap (e.g., 1.2 mils). In other words, some of the thermally conductive material is squeezed-out by the preload force to provide the desired thermal gap. Once this point is reached, the assembly may optionally be thermally cured to set the thermal interface gap. Next, the non-influencing fasteners are actuated to secure the heat sink to the load frame and maintain the desired thermal gap (step 770). Preferably, an appropriate torque is applied to the non-influencing fasteners using an X-pattern sequence to minimize the application of any stresses.

Thermal sensors may be used to measure the thermal interface gap achieved by method 700. If the desired thermal interface gap is not achieved, the unit may be simply reworked by removing the heat sink/load arm assembly from the load frame/spring assembly, and cleaning the thermally conductive material from the semiconductor chip, and returning to step 740.

It should be understood that the invention is not necessarily limited to the specific process, arrangement, materials and components shown and described above, but may be susceptible to numerous variations within the scope of the invention. For example, although the above-described exemplary aspects of the invention are believed to be particularly well suited for mounting a heat sink in contact with an electronic component, it is contemplated that the concepts of the presently disclosed non-influencing fastener can be used in other applications as well, such as shaft mountings for hard disk drives.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A non-influencing fastener disposed within a bore in a heat sink and threaded into a load frame for securing the heat sink to the load frame, the non-influencing fastener comprising:
   a threaded fastener with a head;
   a tapered ring disposed on the threaded fastener below the head of the threaded fastener and having a tapered lower peripheral surface; and
   a sealing ring disposed on the threaded fastener and engaging the tapered lower peripheral surface of the tapered ring,
   wherein compression of the rings by turning of the threaded fastener into the load frame causes the sealing ring to expand against the bore of the heatsink.

2. The non-influencing fastener of claim 1, further comprising:
   a load washer disposed on the threaded fastener between the sealing ring and the load frame.

3. The non-influencing fastener of claim 1, wherein the sealing ring has a curved outer surface.

4. The non-influencing fastener of claim 1, wherein the sealing ring has a circular cross-section.

5. The non-influencing fastener of claim 1, wherein the sealing ring is a metal split ring having a tapered inner surface.

6. The non-influencing fastener of claim 1, wherein the sealing ring is made of one of a low yield strength metal and an elastomer.

7. A method for securing a heat sink to a load frame comprising:
   providing a threaded fastener having a head;
   providing on the threaded fastener below the head a tapered ring having a tapered lower peripheral surface;
   providing on the threaded fastener a sealing ring engaging the tapered lower peripheral surface of the tapered ring;
   inserting the threaded fastener with the rings into a bore in the heatsink; and
   compressing the rings by threading the threaded fastener into the load frame so as to cause the sealing ring to expand against the bore of the heatsink.

8. The method of claim 7, further comprising:
   providing a load washer on the threaded fastener between the sealing ring and the load frame.

9. The method of claim 7, wherein the sealing ring has a curved outer surface.

10. The method of claim 7, wherein the sealing ring has a circular cross-section.

11. The method of claim 7, wherein the sealing ring is a metal split ring having a tapered inner surface.

12. The method of claim 7, wherein the sealing ring is made of one of a low yield strength metal and an elastomer.

13. A heat transfer apparatus comprising:
   a load frame having an open region exposing a surface of an electronic component;
   a heat sink disposed on the load frame and having a surface in thermal contact with the surface of the electronic component through a thermally conductive material, the load frame applying a preload force to the heat sink to compress the thermally conductive material and achieve a desired thermal interface gap between the surface of the heat sink and the surface of the electronic component; and
   at least one non-influencing fastener disposed within a bore of the heat sink and threaded into the load frame to secure the heat sink to the load frame and maintain the desired thermal interface gap,
   wherein the at least one non-influencing fastener includes:
      a threaded fastener with a head;
      a tapered ring disposed on the threaded fastener below the head of the threaded fastener and having a tapered lower peripheral surface; and
      a sealing ring disposed on the threaded fastener and engaging the tapered lower peripheral surface of the tapered ring,
      wherein compression of the rings by turning of the threaded fastener into the load frame causes the sealing ring to expand against the bore of the heatsink.

14. The heat transfer apparatus of claim 13, wherein the non-influencing fastener further includes a load washer disposed on the threaded fastener between the sealing ring and the load frame.

15. The heat transfer apparatus of claim 13, wherein the sealing ring of the non-influencing fastener has a curved outer surface.

16. The heat transfer apparatus of claim 13, wherein the sealing ring of the non-influencing fastener has a circular cross-section.

17. The heat transfer apparatus of claim 13, wherein the sealing ring of the non-influencing fastener is a metal split ring having a tapered inner surface.

18. The heat transfer apparatus of claim 13, wherein the sealing ring of the non-influencing fastener is made of one of a low yield strength metal and an elastomer.

* * * * *